US012641797B2

(12) United States Patent
Chang et al.

(10) Patent No.: US 12,641,797 B2
(45) Date of Patent: May 26, 2026

(54) RRAM STRUCTURE AND METHOD OF FABRICATING THE SAME

(71) Applicant: UNITED MICROELECTRONICS CORP., Hsin-Chu City (TW)

(72) Inventors: Kai-Jiun Chang, Taoyuan City (TW); Yu-Huan Yeh, Taichung City (TW); Chuan-Fu Wang, Miaoli County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 383 days.

(21) Appl. No.: 18/221,872

(22) Filed: Jul. 13, 2023

(65) Prior Publication Data

US 2025/0008745 A1     Jan. 2, 2025

(30) Foreign Application Priority Data

Jun. 29, 2023    (TW) .................................. 112124319

(51) Int. Cl.
| | |
|---|---|
| *H10B 63/00* | (2023.01) |
| *H10N 70/00* | (2023.01) |
| *H10N 70/20* | (2023.01) |
| *H10N 79/00* | (2026.01) |

(52) U.S. Cl.
CPC ............. *H10B 63/22* (2023.02); *H10N 70/24* (2023.02); *H10N 70/826* (2023.02); *H10N 70/841* (2023.02); *H10N 70/8833* (2023.02); *H10N 79/00* (2023.02)

(58) Field of Classification Search
CPC ... H10B 63/22; H10N 70/841; H10N 70/8833
See application file for complete search history.

(56) References Cited

U.S. PATENT DOCUMENTS

| | | | |
|---|---|---|---|
| 9,018,037 B1 | 4/2015 | Nardi | |
| 9,577,009 B1 | 2/2017 | Shih | |
| 10,003,021 B2 | 6/2018 | Walls | |
| 2015/0109093 A1* | 4/2015 | Higano | .............. H10N 70/8833 338/20 |
| 2020/0328350 A1 | 10/2020 | Yang | |
| 2021/0184114 A1 | 6/2021 | Chang | |

* cited by examiner

*Primary Examiner* — Shih Tsun A Chou
(74) *Attorney, Agent, or Firm* — Winston Hsu

(57) ABSTRACT

An RRAM structure includes a bottom electrode, a resistive switching layer, a top electrode, a spacer and a conductive line. The bottom electrode is a first cylinder. The resistive switching layer includes a second cylinder and a three-dimensional disk. A first bottom of the second cylinder directly contacts a top surface of the three-dimensional disk. The top electrode is a third cylinder. The third cylinder includes a top base, a second bottom base and a sidewall. The first cylinder is embedded within the second cylinder and the three-dimensional disk. The second cylinder is embedded within the third cylinder and the second bottom base of the third cylinder directly contacts the top surface of the three-dimensional disk. The spacer surrounds and directly contacts a side surface of the three-dimensional disk. The conductive line encapsulates the top base and the sidewall of the third cylinder.

10 Claims, 7 Drawing Sheets

RRAM STRUCTURE AND METHOD OF FABRICATING THE SAME

BACKGROUND OF THE INVENTION

1. Field of the Invention

The present invention relates to a resistive random access memory (RRAM), in particular to an RRAM and a fabricating method for of an RRAM with increased resistance difference between a high resistance state and a low resistance state.

2. Description of the Prior Art

Nonvolatile memory is capable of retaining the stored information even when unpowered. Non-volatile memory may be used for secondary storage or long-term persistent storage. RRAM technology has been gradually recognized as having exhibited those semiconductor memory advantages.

RRAM cells are non-volatile memory cells that store information by changes in electric resistance, not by changes in charge capacity. In general, the resistance of the resistive switching layer varies according to an applied voltage. An RRAM cell can be in a plurality of states in which the electric resistances are different. Each different state may represent a digital information. The state can be changed by applying a predetermined voltage or current between the electrodes. A state is maintained as long as a predetermined operation is not performed.

With the growth of electronic data, the demand for memory with high capacity, higher read/write endurance and faster read/write speed is also increased. In order to achieve operation with high performance, it is necessary to increase the retention and endurance of RRAM.

SUMMARY OF THE INVENTION

According to a preferred embodiment of the present invention, an RRAM structure includes a bottom electrode, a resistive switching layer, a top electrode, a spacer and a conductive line. The bottom electrode is a first cylinder. The resistive switching layer includes a second cylinder and a three-dimensional disk, wherein a first bottom base of the second cylinder directly contacts a top surface of the three-dimensional disk. The top electrode is a third cylinder, wherein the third cylinder includes a top base, a second bottom base and a sidewall, the first cylinder is embedded within the second cylinder and the three-dimensional disk, the second cylinder is embedded within the third cylinder and the second bottom base of the third cylinder directly contacts the top surface of the three-dimensional disk. The spacer surrounds and directly contacts a side surface of the three-dimensional disk. The conductive line encapsulates the top base and the sidewall of the third cylinder.

According to another preferred embodiment of the present invention, a fabricating method of an RRAM structure includes forming a bottom electrode, a resistive switching layer and a top electrode in sequence, wherein the bottom electrode is a first cylinder, the resistive switching layer includes a second cylinder and a three-dimensional disk, the top electrode is a third cylinder, the third cylinder includes a top base, a second bottom base and a sidewall. Later, a spacer is formed to surround the resistive switching layer.

Finally, a conductive line is formed to encapsulate and directly contact the top base and the sidewall of the third cylinder.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
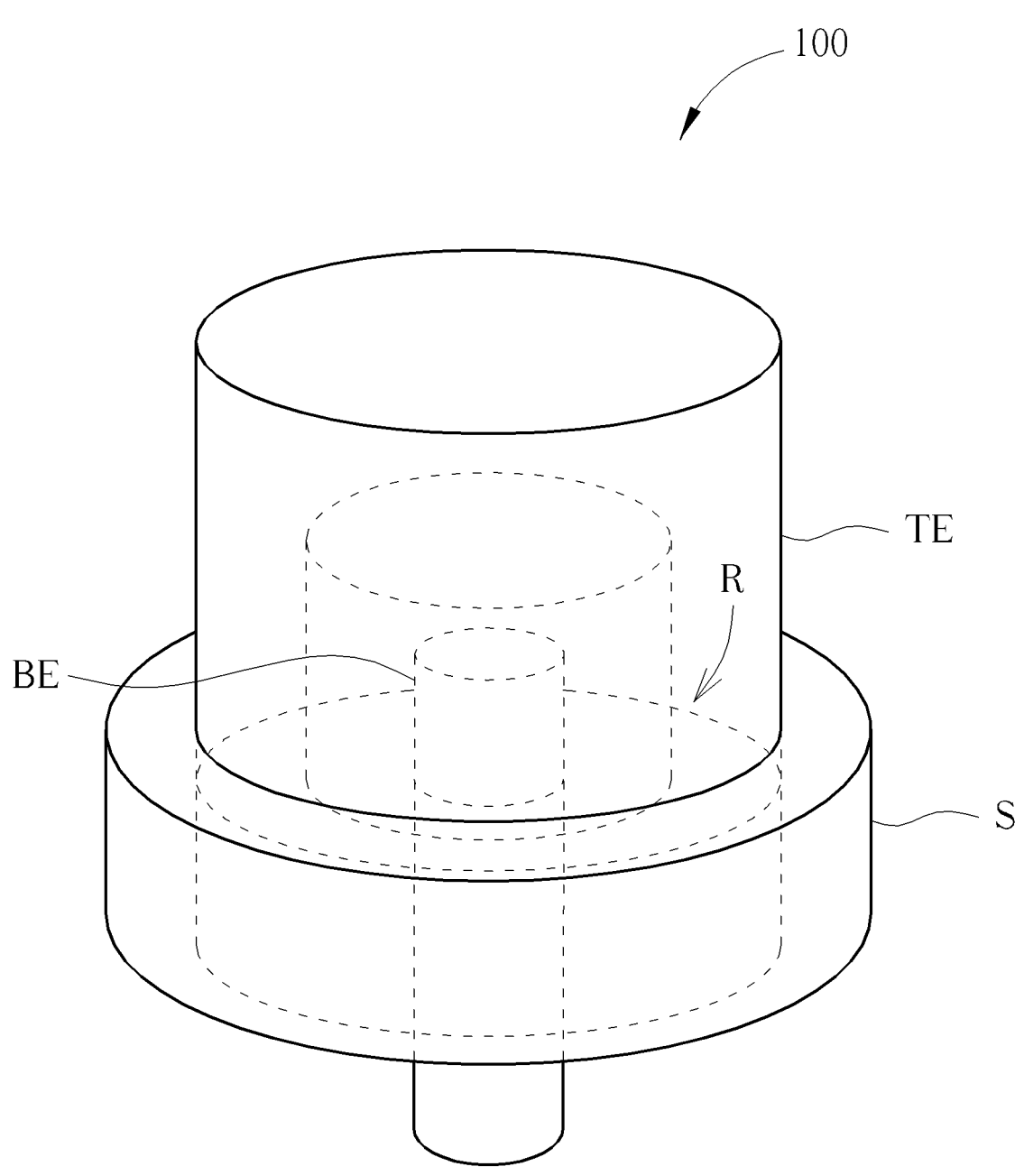
FIG. 1 depicts a three-dimensional diagram of an RRAM according to a preferred embodiment of the present invention.
Figure 2:
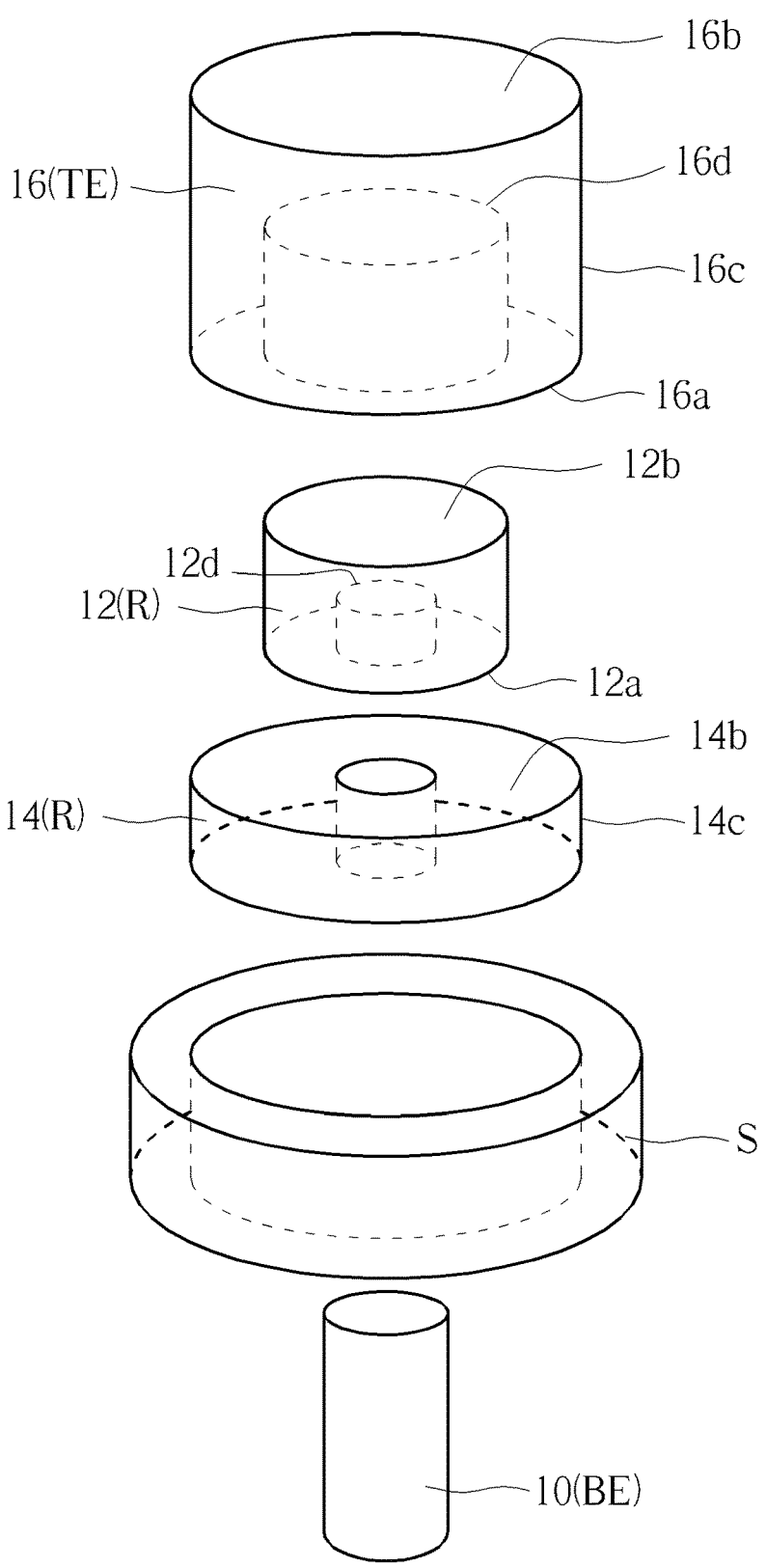
FIG. 2 depicts an exploded view of FIG. 1.
Figure 3:
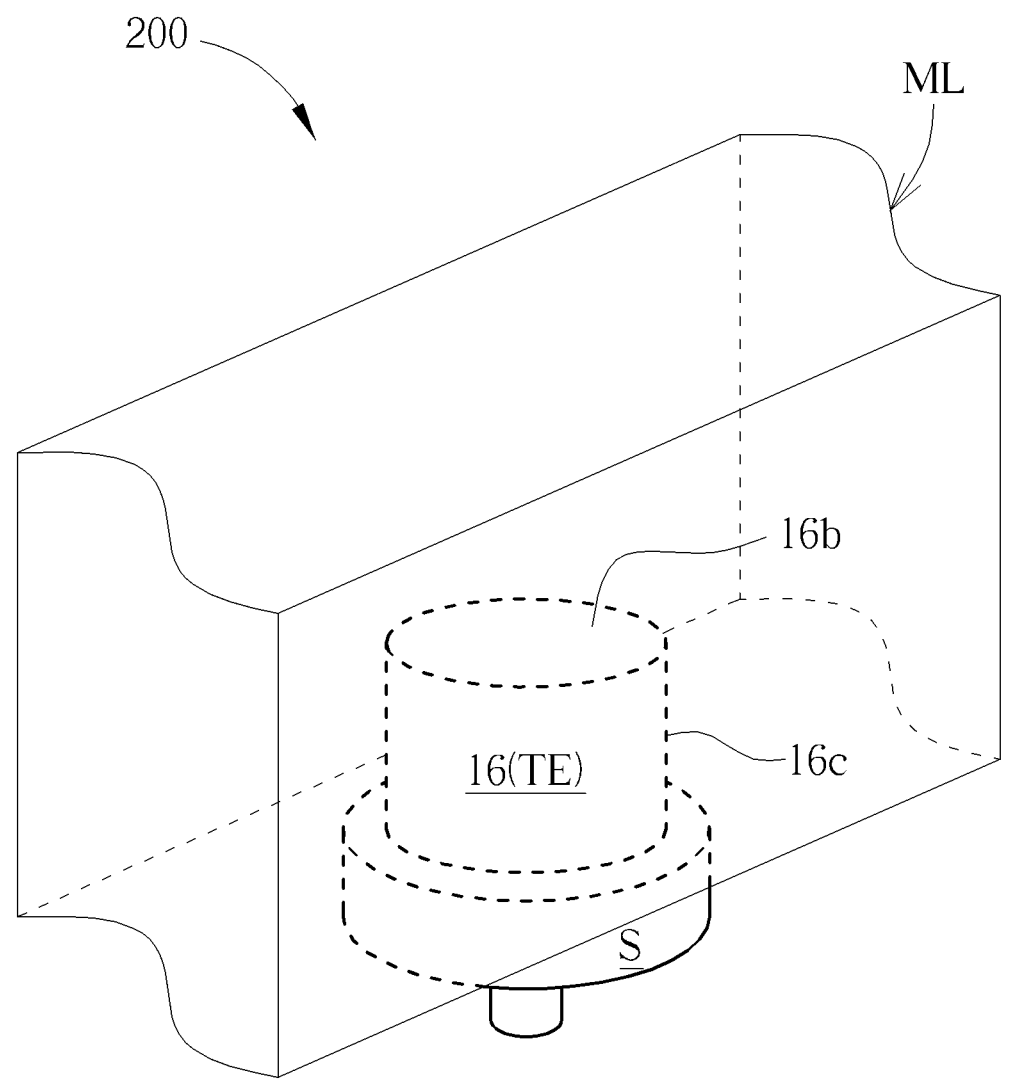
FIG. 3 depicts a three-dimensional diagram of an RRAM structure according to a preferred embodiment of the present invention.

FIG. 1 depicts a three-dimensional diagram of an RRAM according to a preferred embodiment of the present invention. FIG. 2 depicts an exploded view of FIG. 1. FIG. 3 depicts a three-dimensional diagram of an RRAM structure according to a preferred embodiment of the present invention.

As shown in FIG. 1 and FIG. 2, an RRAM 100 includes a bottom electrode BE, a resistive switching layer R, a top electrode TE and a spacer S. The bottom electrode BE is a solid first cylinder 10. The resistive switching layer R includes a second cylinder 12 and a three-dimensional disk 14. The second cylinder 12 has an accommodating space 12d for accommodating the bottom electrode BE, and a first bottom base 12 of the second cylinder 12 directly contacts a top surface 14b of the three-dimensional disk 14. The diameter of the top surface 14b of the three-dimensional disc 14 is greater than the diameter of the first bottom base 12a. The top electrode TE is a third cylinder 16. The third cylinder 16 includes a top base 16b, a second bottom base 16a and a sidewall 16c, and the third cylinder 16 also has an accommodating space 16d. The first cylinder 10 passes through the three-dimensional disk 14 and is embedded in the accommodating space 12d of the second cylinder 12. The second cylinder 12 is embedded in the accommodating space 16d of the third cylinder 16. The second bottom base 16a of the third cylinder 16 directly contacts the top surface 14b of the three-dimensional disk 14. The spacer S surrounds and directly contacts a side surface 14c of the three-dimensional disk 14, and part of the sidewall 16c of the third cylinder 16. That is to say, the spacer S entirely covers a sidewall of the resistive switching layer R aligning with the top electrode TE and an interface between the resistive switching layer R and the top electrode TE. In this way, the resistive switching layer R is kept from being exposed to the environment, thus oxidation of the resistive switching layer R can be prevented and moisture can also be kept from getting into the resistive switching layer R. As shown in FIG. 3, a conductive line ML is disposed on the top electrode TE of the RRAM 100. In details, the conductive line ML encapsulates the top base 16b and the sidewall 16c of the third cylinder 16.

The bottom electrode BE includes tantalum, titanium, titanium nitride, tantalum nitride or other metal materials.

The top electrode TE includes iridium, titanium nitride, tantalum nitride or other metal materials. The resistive switching layer R includes tantalum oxide, nickel oxide, hafnium oxide or other transition metal oxides. The spacer S includes silicon nitride. The conductive line ML includes copper, aluminum, tungsten or other metals or alloys.

FIG. 4 to FIG. 10 are schematic diagrams of a fabricating process of an RRAM structure according to a preferred embodiment of the present invention. The fabrication method of the RRAM 100 and the RRAM structure 200 shown in FIG. 1 to FIG. 3 will be described with reference to FIG. 4 to FIG. 10, wherein elements which are substantially the same as those in FIG. 1 to FIG. 3 are denoted by the same reference numerals; an accompanying explanation is therefore omitted.

Figure 4:
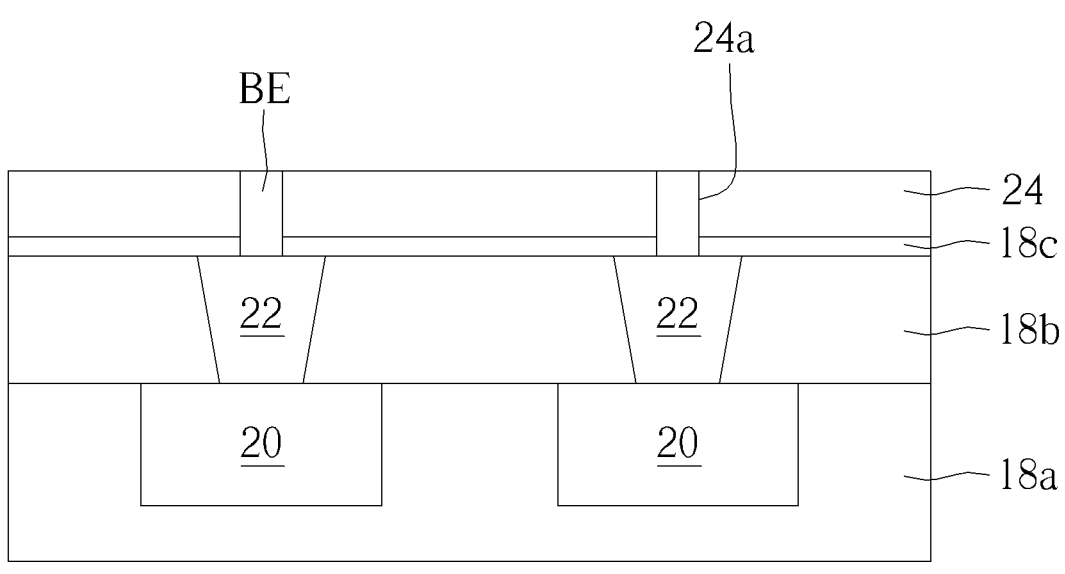
FIG. 4 to FIG. 10 are schematic diagrams of a fabricating process of an RRAM structure according to a preferred embodiment of the present invention.

As shown in FIG. 4, a dielectric layer 18a and a dielectric layer 18b are provided. The dielectric layer 18b covers dielectric layer 18a, and a metal line 20 is disposed within the dielectric layer 18a. A conductive plug 22 is disposed in the dielectric layer 18b, and the conductive plug 22 contacts the metal line 20. Next, a dielectric layer 18c is formed to cover the dielectric layer 18b and contacts the conductive plug 22. The dielectric layer 18c can be nitrogen-doped carbide. Later, a dummy material layer 24 is formed to cover and contact the dielectric layer 18c. The dielectric layer 18a and the dielectric layer 18b may include silicon oxide, silicon nitride or other insulating materials. The metal line 20 and the conductive plug 22 may include copper, aluminum, tungsten or other conductive materials. The dummy material layer 24 includes silicon oxide.

Figure 5:
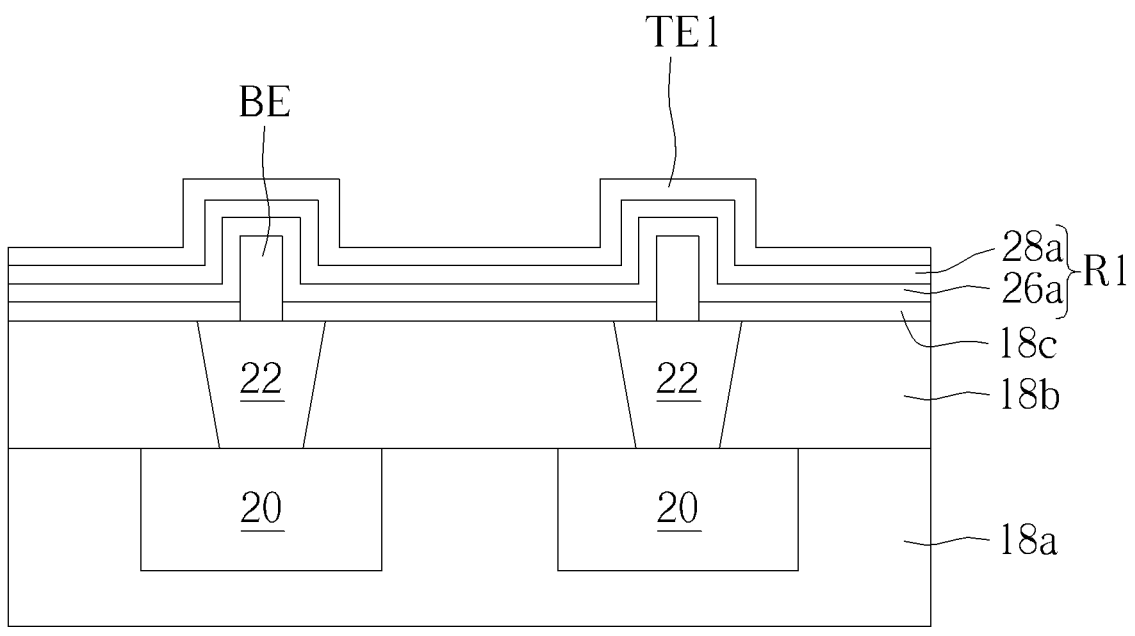

Then, the dummy material layer 24 is etched to form a hole 24a, the hole 24a is preferably in a shape of a cylinder. Afterwards, a bottom electrode material layer (not shown) is formed to cover the dummy material layer 24 and fill in the hole 24a. Subsequently, the bottom electrode material layer is planarized to remove the bottom electrode material layer outside the hole 24a. Now, the bottom electrode material layer remaining in the hole 24a serves as the bottom electrode BE. As shown in FIG. 5, the dummy material layer 24 is removed. Now, the bottom electrode BE protrudes from the dielectric layer 18c. Afterwards, a resistive switching material layer R1 and a top electrode material layer TE1 are sequentially formed to conformally cover the bottom electrode BE and the dielectric layer 18c. According to a preferred embodiment of the present invention, the resistive switching material layer R1 includes an oxygen atom storage material layer 26a and a current formation material layer 28a, the current formation material layer 28a is disposed on the oxygen atom storage material layer 26a. In details, the oxygen atom storage material layer 26a includes tantalum oxide ($TaO_x$, $x<2.5$), and the current formation material layer 28a includes tantalum pentoxide ($Ta_2O_5$).

Figure 6:
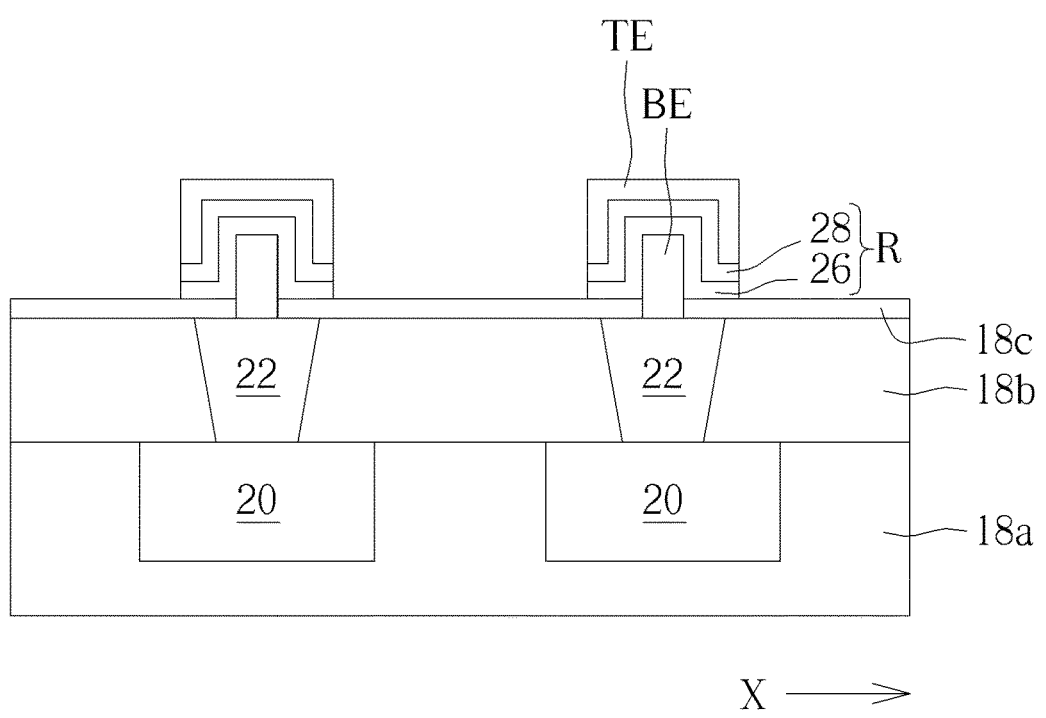

As shown in FIG. 6, the top electrode material layer TE1 and the resistive switching material layer R1 are patterned to form a top electrode TE and a resistive switching layer R. The oxygen atom storage material layer 26a after patterning becomes an oxygen atom storage layer 26, and the current formation material layer 28a after patterning becomes a current formation layer 28a. It is added that: in FIG. 1 and FIG. 2, in order to make the illustrations clear and concise, the resistive switching layer R is shown as a single layer. In fact, in the embodiment of the present invention, the resistive switching layer R preferably includes the oxygen atom storage layer 26 and the current formation layer 28 shown in FIG. 6. Furthermore, when viewing from a sectional view, the top electrode TE forms an inverted U shape, and the resistive switching layer R forms a square wave shape. The square wave shape includes an inverted U shape with a rectangular respectively connecting to two ends of the inverted U shape. The rectangular extends toward a lateral direction X, and the lateral direction X is parallel to a top surface of the dielectric layer 18c.

Figure 7:
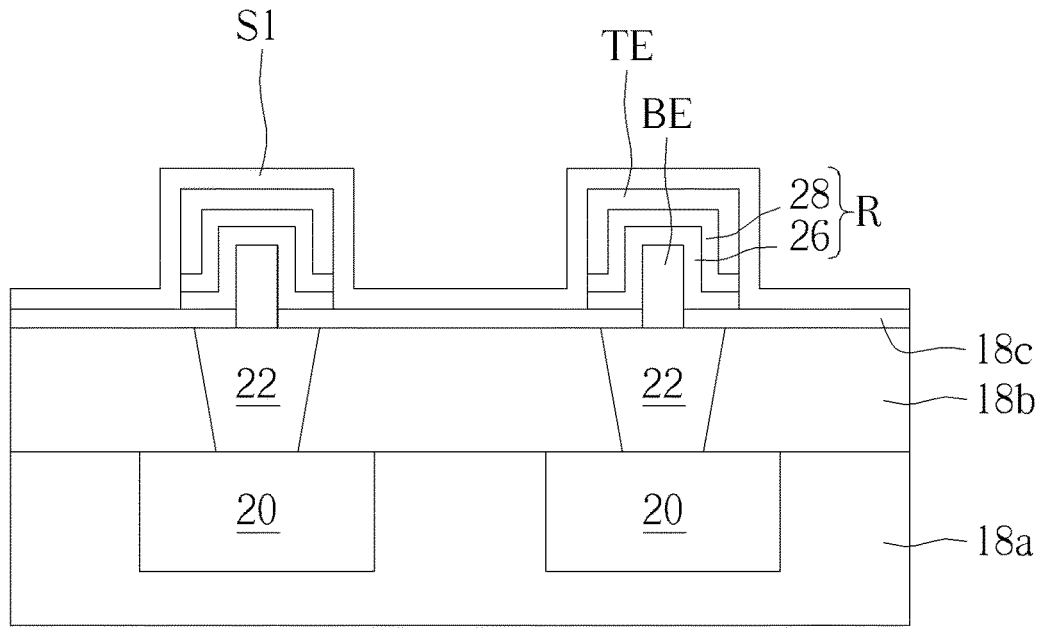
Figure 8:
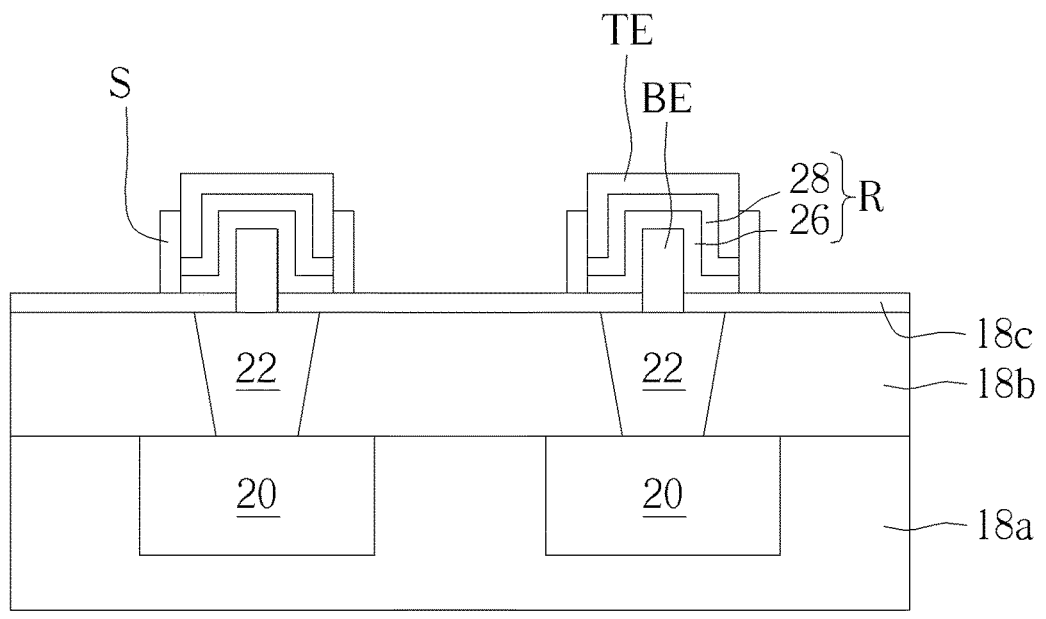
Figure 9:
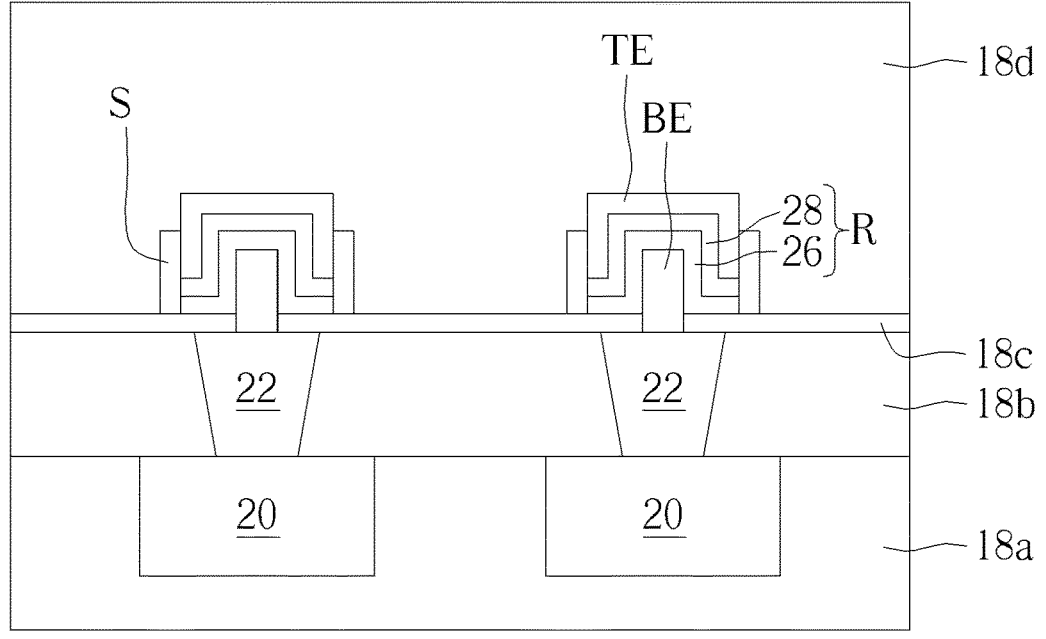
Figure 10:
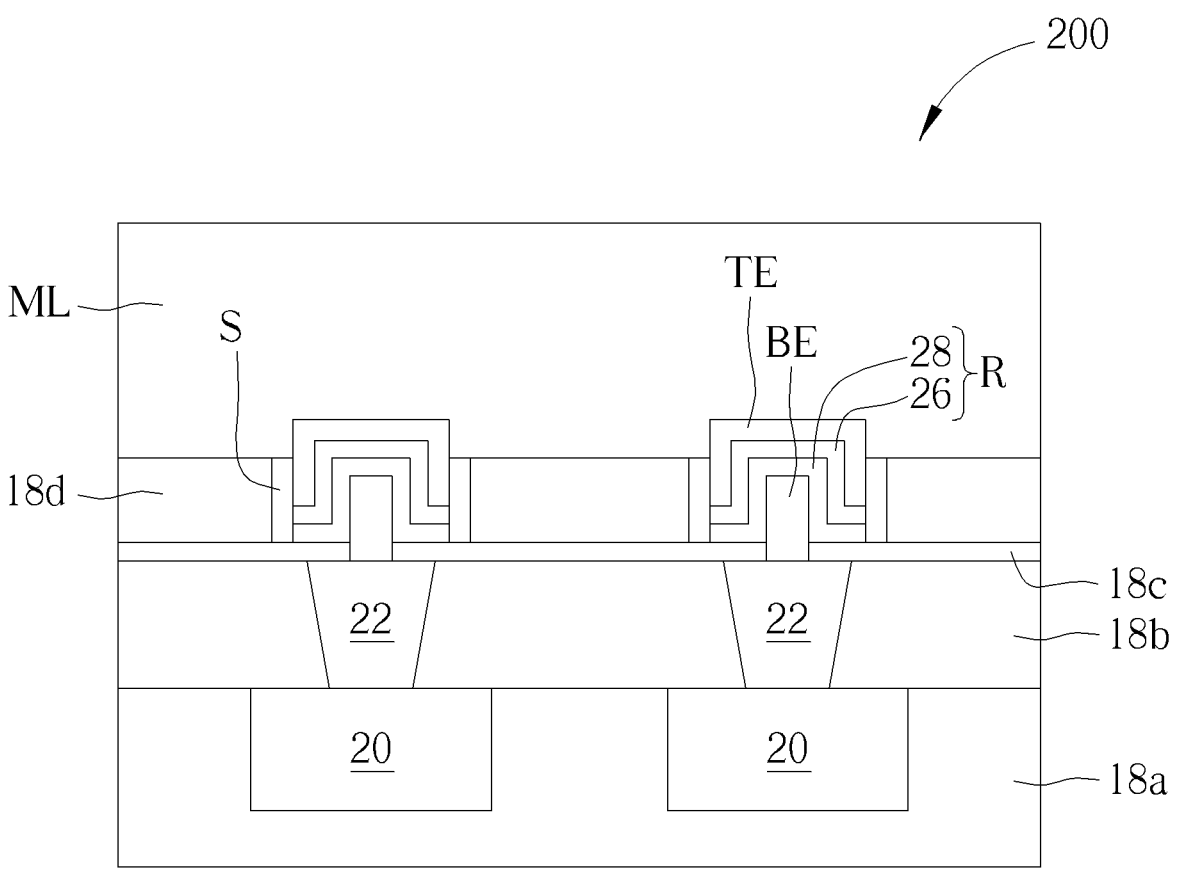

As shown in FIG. 7, a spacer material layer S1 is formed to cover the top electrode TE, the resistive switching layer R and the bottom electrode BE. As shown in FIG. 8, the spacer material layer S1 is etched to form a spacer S. The height of the spacer S should not less than a vertical sidewall of the rectangular at the end of the inverted U shape of the resistive switching layer R. Preferably, the height of the spacer S needs to be greater than the thickness of the resistive switching layer R. That is, the spacer S needs to completely cover the vertical sidewall of the rectangular at the end of the inverted U shape of the resistive switching layer R. According to a preferred embodiment of the present invention, the spacer S can further extend to contact the sidewall of the top electrode TE. In other words, the spacer S completely covers the interface between the resistive switching layer R and the top electrode TE. Now, an RRAM 100 of the present invention is completely. As shown in FIG. 9, a dielectric layer 18d is formed to cover the top electrode TE, the resistive switching layer R, the bottom electrode BE and the spacer S. The dielectric layer 18d is preferably silicon oxide. As shown in FIG. 10, the dielectric layer 18d is etched to expose the top electrode TE. In details, the dielectric layer 18d is etched to form a trench (not shown), so that the top electrode TE is exposed through the bottom of the trench. Next, a conductive line ML is formed to fill the trench and cover the top electrode TE. When viewing from a sectional view, the conductive line ML contacts the inverted U shape formed by the top electrode TE. Now, an RRAM structure 200 of the present invention is completely. Moreover, the etching depth of the dielectric layer 18d can be adjusted according to different requirements. It is noteworthy that when etching the dielectric layer 18d, because the material of the spacer S and the material of the dielectric layer 18d are different, the spacer S is not etched during the etching process. Therefore, even the top electrode TE is completely exposed in the etching process, the spacer S can still protect the resistive switching layer R from been damaged during the etching process. In a preferred embodiment of the present invention, after etching the dielectric layer 18d to form the trench, the thickness of the remaining dielectric layer 18d at the bottom of the trench is still greater than the height of the spacer S to keep the spacer S from exposing through the dielectric layer 18d at the bottom of the trench. However, in other embodiments, the dielectric layer 18d may be etched to expose a portion of the spacer S.

In the present invention, the conductive line ML covers the top base 16b and the sidewall 16c of the third cylinder 16 formed by the top electrode TE, so that the contact area between the top electrode TE and the conductive line ML increases. In this way, during a forming process of the RRAM 100, current is increased, and the forming process of the RRAM 100 can be performed more quickly. In addition, conductive filaments can be formed between the circumference of the second cylinder 12 and the bottom electrode BE and between the bottom electrode BE and a first top base 12b of the second cylinder 12. Therefore, as the total amount of conductive filaments increase, the resistance of the low resistance state of the RRAM 100 is smaller than the resistance of the low resistance state of the general RRAM. In this way, the resistance difference between the high resistance state and the low resistance state of the RRAM

100 of the present invention can be increased, and the retention and read/write endurance of the RRAM 100 can be increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory (RRAM) structure, comprising:

a bottom electrode, wherein the bottom electrode is a first cylinder;

a resistive switching layer comprising a second cylinder and a three-dimensional disk, wherein a first bottom base of the second cylinder directly contacts a top surface of the three-dimensional disk;

a top electrode, wherein the top electrode is a third cylinder, wherein the third cylinder comprises a top base, a second bottom base and a sidewall, the first cylinder is embedded within the second cylinder and the three-dimensional disk, the second cylinder is embedded within the third cylinder and the second bottom base of the third cylinder directly contacts the top surface of the three-dimensional disk;

a spacer surrounding and directly contacting a side surface of the three-dimensional disk; and a conductive line encapsulating the top base and the sidewall of the third cylinder.

2. The RRAM structure of claim 1, wherein a diameter of the top surface of the three-dimensional disk is larger than a diameter of the first bottom base.

3. The RRAM structure of claim 1, wherein the spacer completely covers the side surface of the three-dimensional disk.

4. The RRAM structure of claim 1, wherein the spacer covers and contacts the sidewall of the third cylinder.

5. The RRAM structure of claim 1, further comprising:

a first dielectric layer;

a conductive plug embedded within the first dielectric layer;

a second dielectric layer covering the first dielectric layer and the conductive plug; and a third dielectric layer covering the second dielectric layer, wherein the bottom electrode penetrates the second dielectric layer and directly contacts the conductive plug, the resistive switching layer and the spacer are disposed on the second dielectric layer, the third dielectric layer surrounds the spacer and the third dielectric layer directly contacts the conductive line.

6. The RRAM structure of claim 1, wherein the resistive switching layer comprises an oxygen atom storage layer and a current formation layer, the current formation layer is disposed on the oxygen atom storage layer, the oxygen atom storage layer comprises tantalum oxide ($TaO_x$, x<2.5), and the current formation layer comprises tantalum pentoxide ($Ta_2O_5$).

7. The RRAM structure of claim 1, wherein the conductive line comprises copper, aluminum or tungsten.

8. The RRAM structure of claim 1, wherein the bottom electrode comprises tantalum, titanium, titanium nitride or tantalum nitride.

9. The RRAM structure of claim 1, wherein the top electrode comprises iridium, titanium nitride or tantalum nitride.

10. The RRAM structure of claim 1, wherein the spacer comprises silicon nitride.

* * * * *